United States Patent [19]
Abo

[11] Patent Number: 5,872,741
[45] Date of Patent: Feb. 16, 1999

[54] SEMICONDUCTOR MEMORY DEVICE HAVING VOLTAGE CONVERTERS

[75] Inventor: Hisashi Abo, Tokyo, Japan

[73] Assignee: NEC Corporation, Tokyo, Japan

[21] Appl. No.: 969,340

[22] Filed: Nov. 28, 1997

[30]     Foreign Application Priority Data

Nov. 29, 1996  [JP]  Japan ................................. 8-320375

[51] Int. Cl.⁶ .................................................. G11C 8/00
[52] U.S. Cl. ............... 365/233; 365/230.08; 365/189.05; 365/194
[58] Field of Search .............................. 365/233, 230.08, 365/189.05, 189.01, 194

[56]           References Cited

U.S. PATENT DOCUMENTS

| | | | |
|---|---|---|---|
| 5,450,341 | 9/1995 | Sawada et al. ........................ | 365/218 |
| 5,506,804 | 4/1996 | Yanagisawa et al. ............... | 365/189.11 |
| 5,715,198 | 2/1998 | Braceras et al. ..................... | 365/233 |
| 5,729,493 | 3/1998 | Morton ................................ | 365/185.21 |
| 5,729,502 | 3/1998 | Furutani et al. ..................... | 365/233 |
| 5,748,553 | 5/1998 | Kitamura ............................. | 365/233 |
| 5,781,499 | 7/1998 | Koshikawa ........................... | 365/233 |

*Primary Examiner*—David Nelms
*Assistant Examiner*—Tuan T. Nguyen
*Attorney, Agent, or Firm*—Michael E. Whitham

[57]           ABSTRACT

A semiconductor memory device has a voltage converter for converting a voltage level of an internal clock signal to obtain a high voltage level clock signal. The high level clock signal accelerates the transmission of the clock signal to latch circuits which control the output transistors of the memory device. Another voltage converter is disposed between the data amplifier and the latch circuit instead of the output of the latch circuit, for prevention of current flowing through both the output transistors.

3 Claims, 5 Drawing Sheets

SEMICONDUCTOR MEMORY DEVICE HAVING VOLTAGE CONVERTERS

BACKGROUND OF THE INVENTION (a) Field of the Invention

The present invention relates to a semiconductor memory device and, more particularly, to a synchronous semiconductor memory device capable of operating in synchrony with an external clock signal.

(b) Description of the Related Art

Recently, there is an increasing request that the semiconductor memory device be improved to comply with enhanced CPU performance such as a high-speed operation. However, due to physical limitation for miniaturization of constituent elements or an increase of the integration scale in the semiconductor memory device, this request has not yet been effectively solved. Some of the solutions responding to the request are proposed for synchronous semiconductor memory devices in Patent Publications JP-A-61(1986)-148692, JP-A-6(1994)76566, JP-A-8(1996)-96573 etc.

FIG. 1 is a block diagram of an example of such proposals for the synchronous semiconductor memory devices, which comprises: an address input circuit 101 connected to a plurality of address input terminals ADD; a plurality of control signal input circuits 102, 103, 104 and 105 connected to control signal input terminals RASB, CASB, WEB and CSB, respectively; a clock input circuit 106 for receiving an external clock signal CLK to output a first internal clock signal φ1; a first synchronous signal generator 114 for receiving the first internal clock signal φ1 to output internal second and third clock signals φ2 and φ3; a second synchronous signal generator for receiving the first internal clock signal φ1 to output a fourth internal clock signal φ4, a command decoder 112 for receiving and decoding signals from the input circuits 101, 102, 103, 104 and 105; a latch circuit 113 for receiving outputs from the command decoder 112 to output a read control signal φ8 in synchrony with the second internal clock signal φ2; a data latch circuit 118 for receiving the read control signal φ8 and a fourth internal clock signal φ4 to output an output enable signal φ9; a burst counter 107 for receiving an output from the address input circuit 101 to output a plurality of internal address signals φ5; a column decoder 108 for receiving the internal address signals φ5 to output a plurality of column selection signals φ6; a row decoder 110 for receiving an input from the address input circuit 101 to output a row selection signal φ7; a memory cell array 111 including a plurality of memory cells; a plurality of sense amplifiers 109 for amplifying data signals supplied from the memory cell array 111 by responding to the column selection signals φ6; a plurality of latch circuits 116 for latching outputs from the corresponding sense amplifiers 109 to supply the latched data in synchrony with the third internal clock signal φ3; a data amplifier 117 for receiving outputs from the latch circuits 116 to output a pair of data signals D1T and D1N (D1T/D1N or D1T/N); AND gates AN1 and AN2 for receiving the pair of data D1T/D1N signals and an inverted output enable signal xφ9 to output a pair of data signals D2T/D2N; and an output circuit block 130 including data latch circuits for receiving the data signals D2T/D2N and the fourth internal clock signal φ4; and a pair of output stage transistors TR1 and TR2 for receiving a pair of data signals D3T/D3N corresponding to the data signals D2T/D2N.

In FIG. 1, other circuit elements such as buffer inverters and circuit blocks which are not important to understand the present invention are omitted.

FIG. 2 shows a practical configuration of the output circuit block 130 shown in FIG. 1 together with the synchronous generator 115, wherein the power source designated by VVT is specified as a voltage source supplying a higher voltage than the other power source. The circuit block 130 comprises data latch circuits 119 and 120 for receiving data signals D2T/D2N to control the output timing of the output transistors TR1 and TR2, a voltage converter 51 for receiving data 92 from the latch circuit 119 to output a high-level data or data having a high voltage level corresponding to the higher voltage source VVT, and a first inverter 71 for receiving the high-level data signal from the voltage converter 51 to output the data D3T having a higher voltage corresponding to the higher voltage source VVT, the data signal D3T being supplied to the output transistor TR1, and a second inverter 61 for receiving an output 97 from the data latch circuit 120 to output the data signal D3N to the output transistor TR2.

In FIG. 1, the group of the sense amplifiers 108, latch circuit 116, data amplifier 117, AND gates AN1 and AN2, latch circuits 119 and 120, voltage converter 51, inverters 71 and 61 is provided in number corresponding to the number of output pins DQ of the memory device.

Generally, the output transistors TR1 and TR2 are designed to have a larger current driving capability than other transistors in order for driving an external circuit-having a large parasitic capacitance. For driving the output transistors TR1 and TR2, buffer inverters 71, 61, 62 and 63 are provided in the latch circuits 119 and 120 and-between the latch circuit 119 and 120 and corresponding output transistor TR1 or TR2, as shown in FIG. 2.

The internal clock signal φ4 is generally delayed in transmission along the transmission line between the synchronous clock generator 115 provided in the vicinity of the input side of the memory device and the latch circuits 119 and 120 provided in the vicinity of the output terminal DQ, although a buffer inverter 65 is provided at the output stage of the synchronous clock generator 115 for driving the plurality of latch circuits 119, 120 etc. connected through the transmission line having a large parasitic capacitance.

The voltage converter 51 is provided on the data path for supplying a higher voltage than a normal power source voltage at a node 91 to cancel an ON-resistance of the output transistor TR1, thereby supplying a sufficient high level of the output data signal.

FIG. 3 shows a timing chart of signals in the semiconductor memory device as described above, wherein a case of "CAS latency=" during a read burst operation is exemplified. The term "CAS latency" means clock cycles necessary for supplying a read data through the output pin after an external read command is received. In the case of "CAS latency=3" three clock cycles are necessary for a read-out operation, or in other words, the read data is supplied through the output pin DQ after three clocks are counted from the receipt of the external read command.

During a first clock cycle C1 in Fig.3, an external read command is input in synchrony with the rising edge of the external clock signal CLK. Responding to the external read command, the command decoder 112 supplies an internal read command signal to a latch circuit 113 for instructing a read operation. During a next clock cycle C2, a read control signal φ8 from the latch circuit 113 falls to a low level in synchrony with the first internal clock signal φ2 for effecting a read operation, and the output enable signal φ9 falls to a low level in synchrony with the falling edge of the fourth internal clock signal φ4.

During the second clock cycle C2, the data read out from the memory cell array 111 is output from the latch circuit 116 in synchrony with the third internal clock φ3, and output from the data amplifier 117 as a pair of data signals D1T/D1N. After the output data enable signal φ9 falls to a low level during the clock cycle C2, the data signals D1T/D1N pass through AND gates AN1 and AN2, respectively, as data signals D2T/D2N, which are then supplied to the latch circuits 119 and 120. During a third clock cycle C3, the data signals D2T/D2N are supplied from the latch circuits 119 and 120 in synchrony with the fourth internal clock signal φ4 and delivered through the output transistors and the output pin DQ.

In general, it is requested that the access time be shorter in a semiconductor memory device. For example, synchronous semiconductor integrated circuits are controlled in synchrony with an external clock signal. The total system design for a CPU system can be made easy if a smaller clock access time is realized in the synchronous semiconductor memory device for a device receiving the data output from the semiconductor memory device. In FIG. 3, the clock access time of the synchronous semiconductor memory device is designated by t1, and a set-up time for the device receiving the data, output from the semiconductor memory device is designated by t2. That is, the clock access time t1 of the memory device should be reduced for an easy design of the CPU system.

The clock access time t1 is determined by a sum of a time interval between a rising edge of the external clock signal CLK and the corresponding rising edge of the internal clock signal φ4 which rises after the external clock passes through the clock input circuit 106 and the synchronous clock generator 115, and a time interval between the rising edge of the internal clock signal φ4 and a time instant at which the data signal is output through the output pin after the data signals pass the latch circuits 119 and 120 and drive the output transistors TR1 and TR2.

It is preferred to have less number of buffer stages and proper number of fan-outs along the clock signal path from the clock input circuit 106 to the inputs of the latch circuit receiving the internal clock signal φ4. However, as described before, due to a large parasitic capacitance of the clock line for the internal clock signal φ4, the number of fan-outs increases if the number of buffer stages is reduced, thereby retarding the transmission of the clock signal to increase the clock access time.

The voltage converter 51 in FIG. 2 especially delays the signal transmission from node 92 to node 91, generating a propagation delay for the signal at node 92 larger than, for example, the propagation delay of the signal at node 96 which does not pass the voltage converter. In short, a large clock access time results in the semiconductor memory device because of the voltage converter.

Moreover, due to a timing difference between the pair of data signals D3T/D3N, the order of the timing at which the signal at node 91 falls and the timing at which the signal at node 96 rises, which should be in this order, are reversed, causing a penetration current or pass through current flowing through both the transistors TR1 and TR2. For the protection against the pass-through current, the driving capability of the inverters 61, 62, 63 and 71 may be adjusted. However, such an adjustment sometime involves a difficulty in the design in view of process variation.

SUMMARY OF THE INVENTION

It is an object of the present invention to provide a semiconductor memory device capable of reducing the clock access time of a semiconductor memory device without causing a pass-through current in the output transistors. The present invention provides a semiconductor memory device comprising a plurality of memory cells, an input block for receiving an external read command in synchrony with an external clock signal, a read-out block for reading data from the memory cells in accordance with the external read command, data amplifiers for amplifying data read out from the memory cells to output a pair of data signals, a clock generator for generating a first clock signal in accordance with the external clock signal, a voltage converter for converting a voltage level of the first clock signal to output a second clock signal having an amplitude higher than an amplitude of the first clock signal, a pair of latch circuits for latching the pair of data signals at a first clock of the second clock signal to output the latched data signals at a second clock of the second clock signal subsequent to the first clock, a pair of output transistors for receiving the latched data signals from the pair of latch circuits at the second clock to supply a read data through an output pin According to the present invention, the clock access time can be made small and a pass-through current flowing both the output transistors TR1 and TR2 is prevented by the voltage converter disposed on the internal clock path, and the other voltage converter on the data path disposed ahead of the latch circuit which determines timing of the output data.

The above and other objects, features and advantages of the present invention will be more apparent from the following description, referring to the accompanying drawings.

PREFERRED EMBODIMENTS OF THE INVENTION

Figure 1:
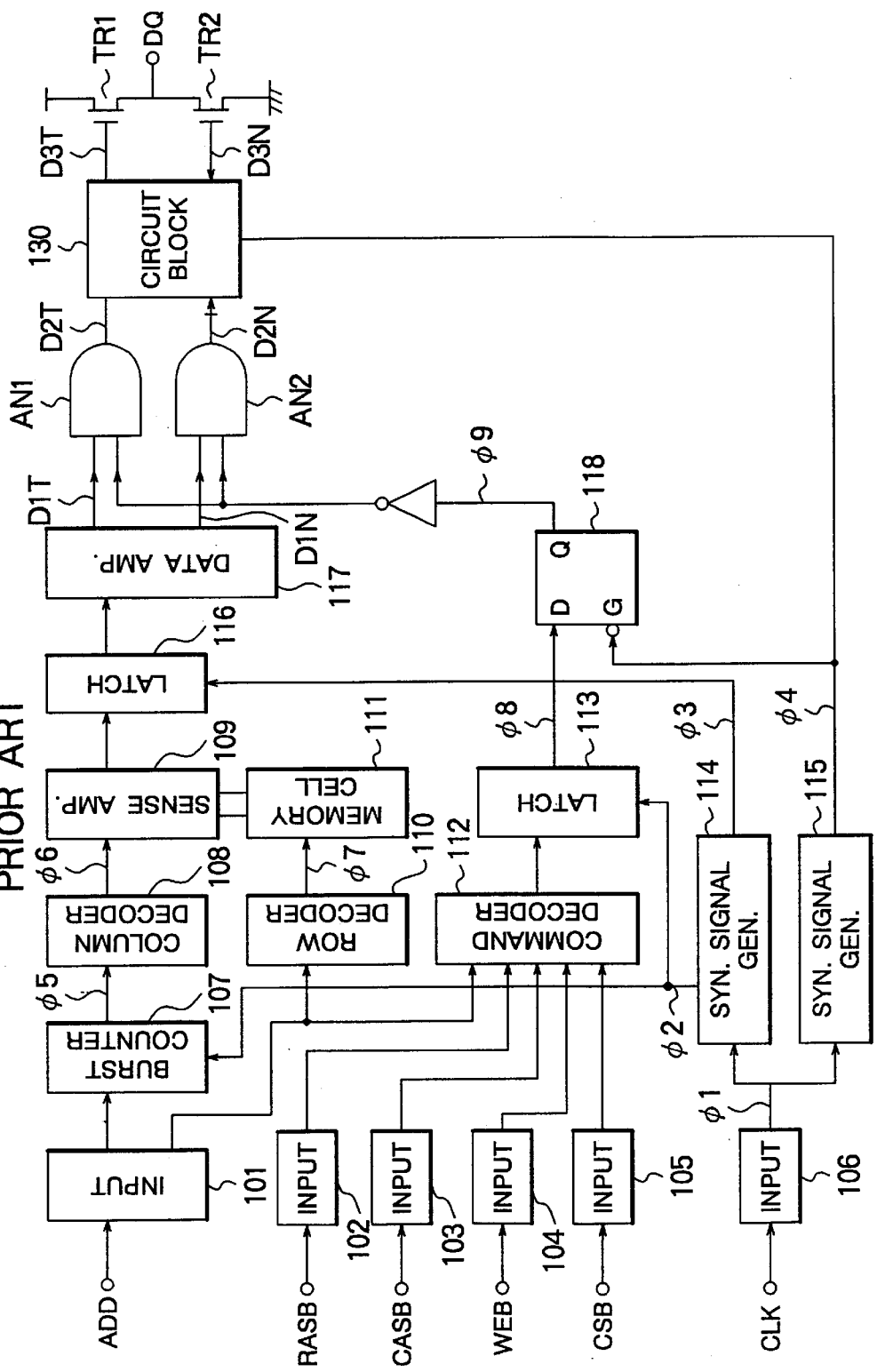
FIG. 1 is a block diagram of a conventional synchronous semiconductor memory device.
Figure 2:
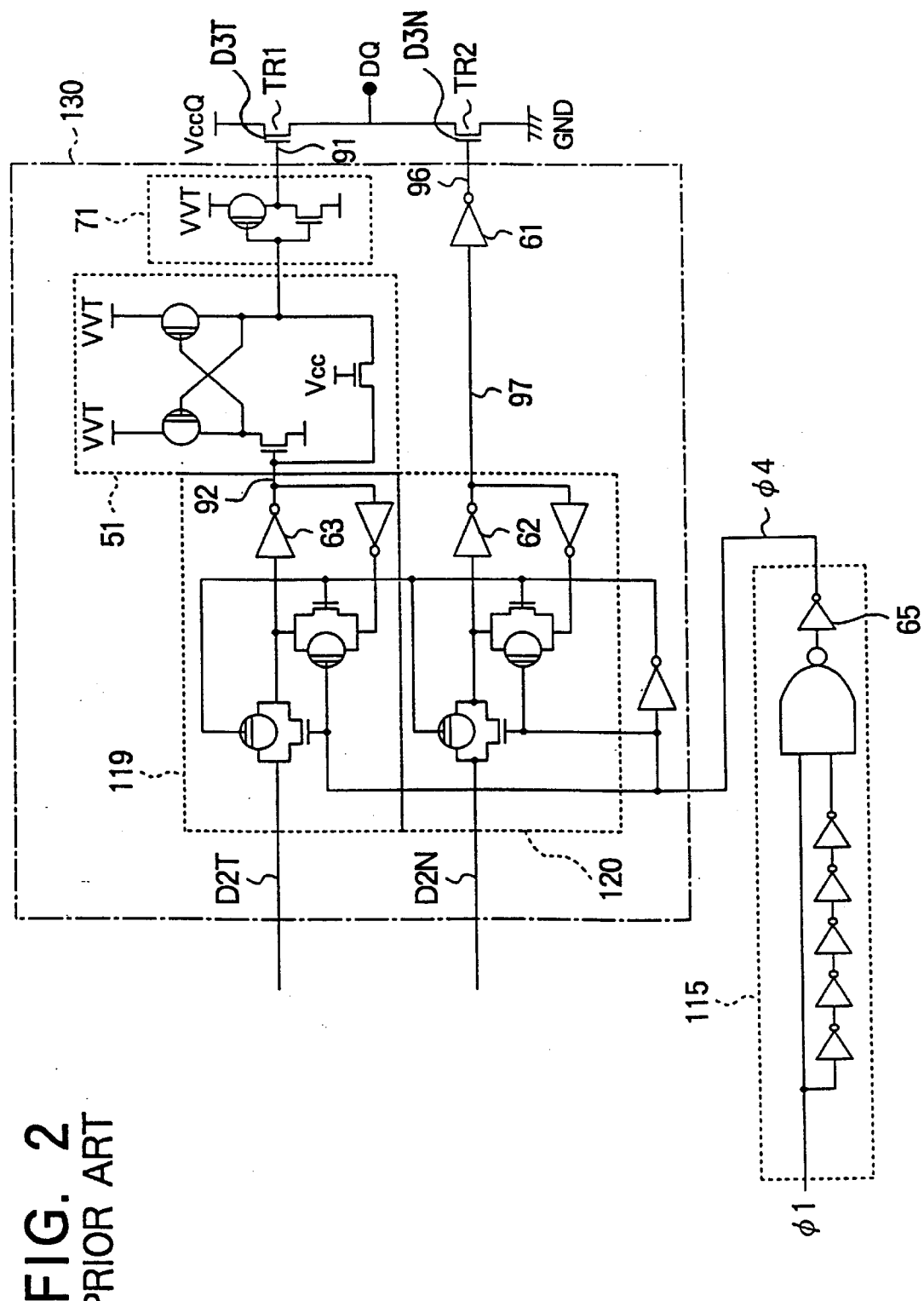
FIG. 2 is a partial block diagram of the memory device of FIG. 1.

Now, the present invention is more specifically described with reference to the accompanying drawings, wherein similar constituent elements are designated by the same reference numerals throughout the drawings.

Figure 4:
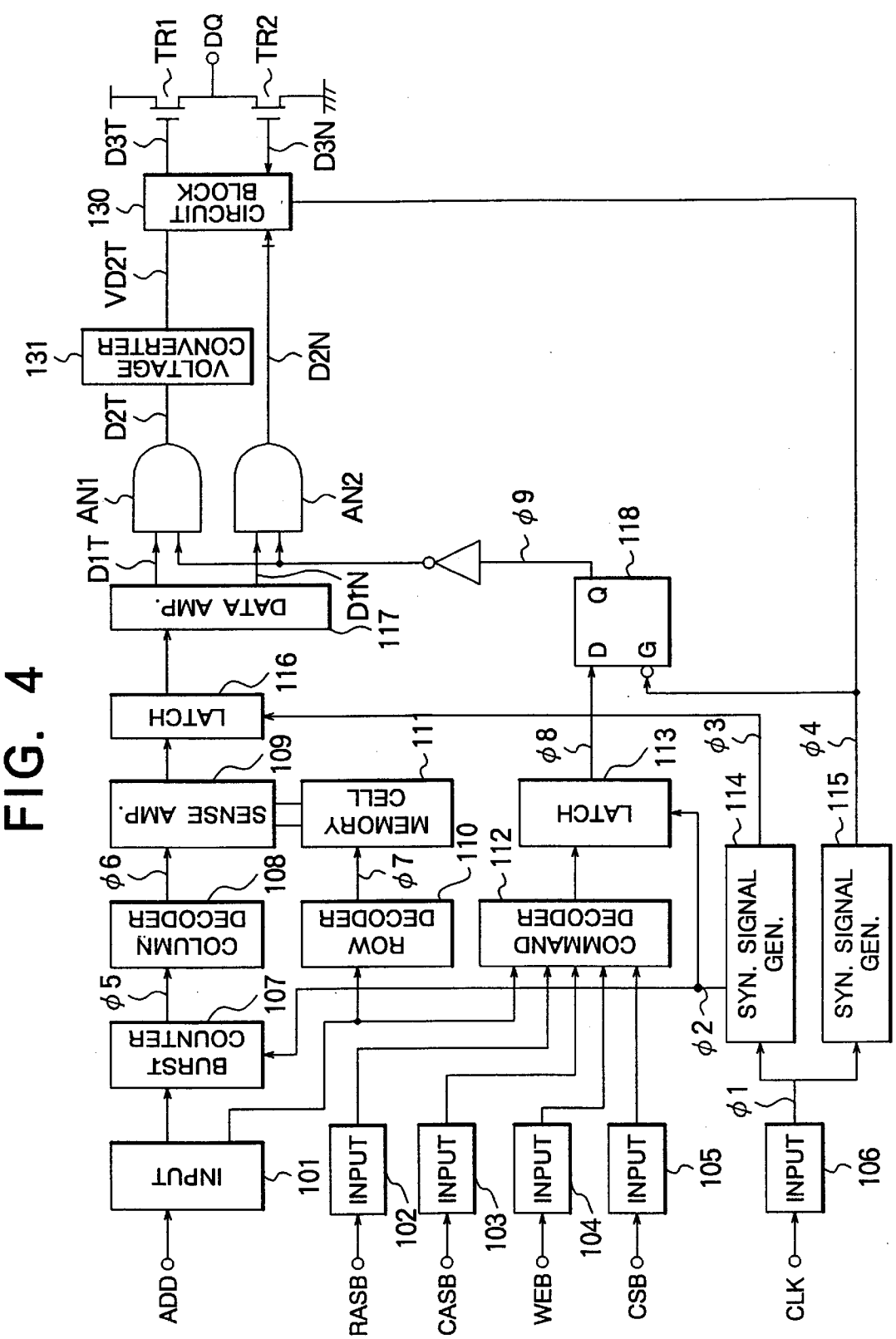
FIG. 4 is a block diagram of a synchronous semiconductor memory device according to an embodiment of the present invention.

Referring to FIG. 4, a synchronous semiconductor memory devices according to an embodiment of the present invention comprises: an address input circuit 101 connected to a plurality of address input terminals ADD; a plurality of control signal input circuits 102, 103, 104 and 105 connected to control signal input terminals RASB, CASB, WEB and CSB, respectively; a clock input circuit 106 for receiving an external clock signal CLK to output a first internal clock signal φ1; a first synchronous signal generator 114 for receiving the first internal clock signal φ1 to output second and third clock internal signals φ2 and φ3; a second synchronous signal generator 115 for receiving the first internal clock signal φ1 to output a fourth internal clock signal φ4; a command decoder 112 for receiving and decoding signals from the input circuits 101, 102, 103, 104 and 105; a latch circuit 113 for receiving outputs from the command decoder 112 to output a read control signal φ8 in synchrony with the second internal clock signal φ2; a data latch circuit 118 for receiving the read control signal φ8 to output an output enable signal φ9 in synchrony with the fourth internal clock signal φ4; a burst counter 107 for receiving an output from the address input circuit 101 to output a plurality of internal address signals φ5; a column decoder 108 for receiving the internal address signals φ5 to output a plurality of column selection signals φ6; a row decoder 110 for receiving an input from the address input circuit 101 to output a row selection signal φ7; a memory cell array 111 including a plurality of memory cells; a plurality of sense amplifiers 109 for amplifying data signals supplied from the memory cell array 111 by responding to the column selection signals φ6; a plurality of latch circuits 116 for latching outputs from the sense amplifiers 109 to supply the latched data in synchrony with the third internal clock signal φ3; a plurality of data amplifiers 117 each for receiving an output from the latch circuit 116 to output a pair of data signal D1T and D1N (D1T/D1N or D1T/N); a pair of AND gates AN1 and AN2 for receiving the pair of data signals D1T/D1N and an inverted output enable signal Xφ9 to output a pair of data signals D2T/D2N, a voltage converter 131 for converting the voltage level of the data signal D2T to output a high-level data signal VD2T having a high voltage level, an output block 130 for receiving the data signals VD2T and D2N from voltage converter 131 and AND circuit AN2 to output a pair of data signals D3T/D3N, one of which has a high voltage level, and a pair of output transistors TR1 and TR2 to output a read data through an output pin DQ.

Figure 5:
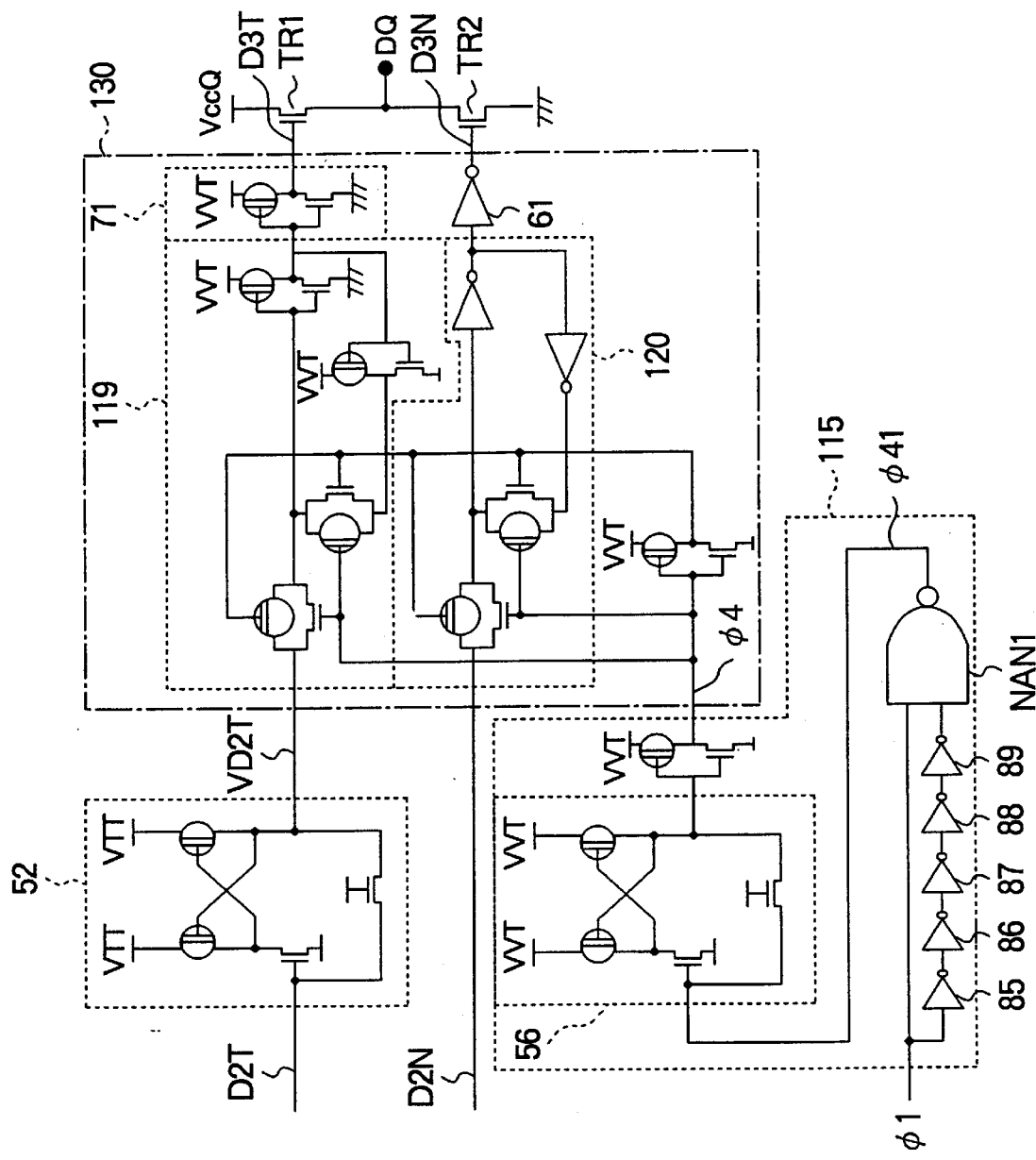
FIG. 5 is a partial block diagram of the memory device of FIG. 4

Referring to FIG. 5 showing the circuit block 130 together with adjacent circuit elements, the circuit block 130 comprises a pair of first and second data latch circuits 119 and 120 for receiving the data VD2T and D2N to output data signals in synchrony with fourth internal clock signal φ4, a first inverter 71 for receiving an output from the first latch circuit 119 to output a data signal D3T of a higher voltage level, a second inverter 61 for receiving an output from the second latch circuit 120 to output a data signal D3N, and output transistors TR1 and TR2 for receiving a pair of data signals D3T/D3N corresponding to the data signals D2T/D2N. The pair of serial output transistors TR1 and TR2 output read-out data through the output pin DQ to an external device.

The synchronous signal generator 115 comprises a plurality of cascaded inverters for generating a delayed, inverted signal from the first internal clock signal φ1 corresponding to the external clock signal CLK, a NAND gate NAN1 for receiving the first internal clock signal φ1 and the inverted signal of the clock signal φ1 to output a one-shot signal φ41, and a combination of another voltage converter 56 and an inverter for receiving the output φ41 of the NAND gate NAN1 to output the internal clock signal φ4 having a high amplitude. In the above configuration, the voltage converters 52 and 56 are not provided on the data path between output transistor TR1 and the latch circuit 119 which controls the output timing of the output transistor TR1.

Figure 3:
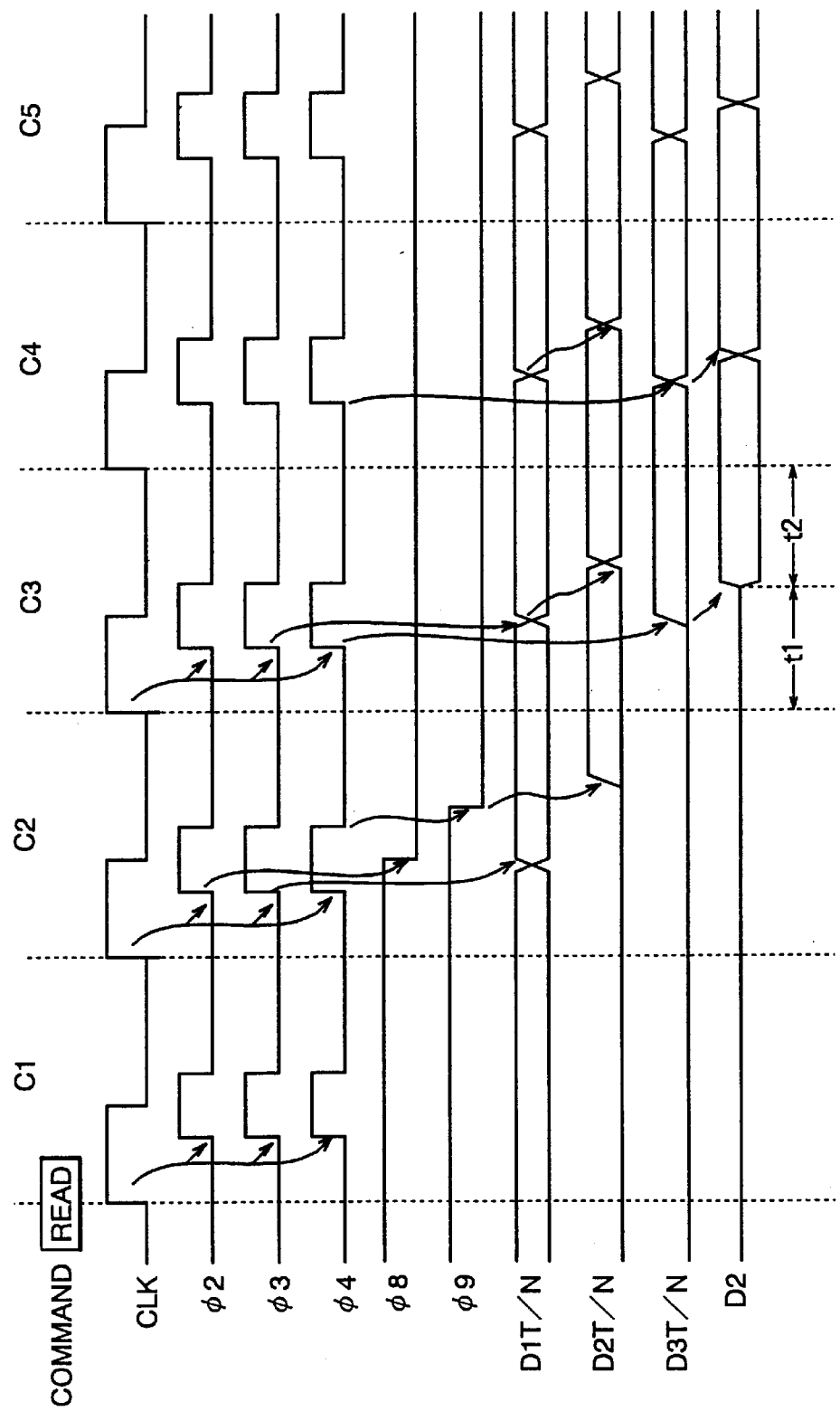
FIG. 3 is a timing chart of signals in the memory devices of FIG. 1 and FIG. 4.

Referring again to FIG. 3, operation of the present embodiment will be described in the case wherein CAS latency is 3. First, during a first clock cycle C1, an external read command is supplied to the memory device in synchrony with the rising edge of the external clock signal CLK. The command decoder 112 outputs an internal read command signal to the latch circuit 113, which latches the internal read command signal. During the next clock cycle C2, a read control signal φ8 from the latch circuit 113 falls from a high level to a low level in synchrony with the internal clock signal φ2. An output enable signal φ9 from the data latch circuit 118 then falls in synchrony with the falling edge of the internal clock signal φ4 supplied from the synchronous signal generator 115.

On the other hand, during the clock cycle C2, the data read out from the memory cell array 111 is supplied from the latch circuit 116 in synchrony with the third internal clock signal φ3, then amplified in the data amplifier 117 and supplied as a pair of data signals D1T/D1N. After the output data enable signal φ9 falls to a low level during the second clock cycle C2, the data signals D1T/D1N are supplied as data signals D2T/D2N after passing through AND gates AN1 and AN2. The data signal D2T is supplied to the voltage converter 131 for voltage conversion, and then supplied as the data signal VD2T to the latch circuit 119, together with the data signal D2N which is supplied to the latch circuit 120. During a third clock cycle C3, the data signals are supplied from the latch circuits 119 and 120 in synchrony with the internal clock signal φ4 through the inverters 71 and 61, output transistors TR1 and TR2, and output pin DQ.

In FIG. 4, the clock signal φ1 supplied from the clock input circuit 106 is processed by the synchronous signal generator 115, wherein NAND gate generates a one-shot signal φ41 which is then processed by the voltage converter 56 and the inverter into the fourth internal clock signal φ4 having an opposite phase with respect to the first clock signal φ1.

Although the voltage converter 56 disposed for generating the clock signal φ4 functions for slightly delaying the internal clock signal φ4 propagating in the vicinity of the input side of the memory device, the large signal amplitude of the internal clock signal φ4 accelerates, to a greater extent, the transmission of the clock signal φ4 through the clock signal transmission line having a large parasitic capacitance and driving a plurality of latch circuits Accordingly, the latch circuits 119 and 120 receive the internal clock signal φ4 in a smaller delay time, The data signal D2T on the data path is converted into the data signal VD2T by the voltage converter 52 and supplied to the latch circuit 119. The transmission delay caused by the voltage converter 52 does not affect the clock access time because of the configuration in which the data signal VD2T is supplied to the latch circuit 119 during the clock cycle C2 to wait the next clock cycle C3, at which both data signals are supplied to the respective inverters 71 and 61.

As described in the case of "CAS latency=", a slight transmission delay by the voltage converter 52 does not affect the clock access time so long as the semiconductor memory device has a mode of CAS latency equal to or more than two, because the data signal is supplied to the latch circuit 119 during a previous clock cycle for waiting the next clock cycle at which the data signal is output from the latch circuit 115.

The data signal supplied from the latch circuit 119 at the clock cycle which effects the output timing of the data signal does not pass a voltage converter thereafter. Accordingly, a difference between the timings of the pair of data signals does not result.

The absence of the voltage converter in the data transmission path after passing the latch circuit 119 enables to prevent the current flowing through both the output transistors TR1 and TR2 because of the substantially equal delay between both the pair of data signals.

Since the above embodiments are described only for examples, the present invention is not limited to the above embodiments and various modifications or alterations can be easily made therefrom by those skilled in the art without departing from the scope of the present invention.

What is claimed is:

1. A semiconductor memory device comprising a plurality of memory cells, an input block for receiving an external read command in synchrony with an external clock signal, a read-out block for reading data from said memory cells in accordance with said external read command, data amplifiers for amplifying data read out from said memory cells to output a pair of data signals, a clock generator for generating a first clock signal in accordance with said external clock signal, a voltage converter for converting a voltage level of said first clock signal to output a second clock signal having an amplitude higher than an amplitude of said first clock signal, a pair of latch circuits for latching said pair of data signals at a first clock of said second clock signal to output the latched data signals at a second clock of said second clock signal subsequent to said first clock, a pair of output transistors for receiving said latched data signals from said pair of latch circuits at said second clock to supply a read data through an output pin.

2. The semiconductor memory device as defined in claim 1, further comprising a command control block for controlling a timing of said pair of data signals in accordance with said first clock signal.

3. The semiconductor memory device as defined in claim 1, further comprising another voltage converter, inserted between said data amplifiers and said pair of latch circuits, for converting a voltage level of one of said pair of data signals to output a high-level data signal.

* * * * *